(12) United States Patent
Chang

(10) Patent No.: US 6,552,914 B1
(45) Date of Patent: Apr. 22, 2003

(54) CIRCUIT BOARD ASSEMBLY MECHANISM

(75) Inventor: Chang-Yu Chang, Taipei Hsien (TW)

(73) Assignee: Aten International Co., Ltd., Taipei (TW)

(*) Notice: Subject to any disclaimer, the term of this patent is extended or adjusted under 35 U.S.C. 154(b) by 0 days.

(21) Appl. No.: 09/535,190

(22) Filed: Mar. 27, 2000

(51) Int. Cl.⁷ ................................................ H05K 7/14
(52) U.S. Cl. .................. 361/796; 361/740; 361/742; 361/752; 361/758; 361/759; 361/801; 361/809; 361/825
(58) Field of Search .............................. 361/684, 686, 361/736, 737, 740–742, 744, 745, 752, 753, 756, 758, 759, 796, 801, 802, 807–810, 804, 825; 439/76.1

(56) References Cited

U.S. PATENT DOCUMENTS

| | | | |
|---|---|---|---|
| 5,124,888 A | * 6/1992 | Suzuki et al. ............... | 361/740 |
| 5,502,620 A | * 3/1996 | Funck et al. ............... | 361/753 |
| 5,740,019 A | * 4/1998 | Lee ............................ | 361/759 |
| 5,863,141 A | * 1/1999 | Hong et al. .................. | 400/692 |
| 6,000,559 A | * 12/1999 | Stopyra et al. ............. | 361/752 |
| 6,005,775 A | * 12/1999 | Chiu ........................... | 361/752 |
| 6,188,017 B1 | * 2/2001 | August, Jr. .................. | 361/753 |

* cited by examiner

Primary Examiner—Jayprakash N. Gandhi
Assistant Examiner—John B. Vigushin

(57) ABSTRACT

A circuit board assembly mechanism for assembling a first circuit board in suspension in the circuit board assembly mechanism includes a base and connecting bracket. The base has a pillar extruding from a bottom plate of the base and a side plate bending from a wing of the bottom plate. The pillar is positioned corresponding to a first hole of first circuit board and houses it atop by inserting a fixer through the first hole into the pillar. The connecting bracket has a first end and a second end in opposition to each other for connecting the first circuit board with the side plate of the base by fixing the first end on the first circuit board and restricting the second end on the side plate, thereby assembling the first plate in suspension within the base by the pillar and the connecting bracket and reserving the space between the first circuit board and the bottom plate for assembling a second circuit board.

10 Claims, 4 Drawing Sheets

CIRCUIT BOARD ASSEMBLY MECHANISM

FIELD OF THE INVENTION

This invention relates to a circuit board assembly mechanism, and more specifically to a circuit board assembly mechanism for stacking circuit boards up within an input/output (I/O) switch box.

BACKGROUND OF THE INVENTION

For current electronic devices, the more compact of their volumes, the more competitive of their commercial interests. Because the circuit board is the most space-consuming components in an electronic device, the circuitry layout turns to be a compelling issue of downsizing the circuit board and minimizing the volume of the electronic device.

Typically, a circuit board is fabricated as a single module with specific functions, and different circuit boards are assembled in a single case to form an electronic device. As a result of the modular circuit board, the assembling task of the electronic device is highly reduced. For instance, an I/O switch box could be fabricated by selectively combining several circuit boards with desired functions, such as a circuit board providing keyboard/mouse connecting ports and another circuit board providing monitor interfacial ports. Thus, the circuit boards, which can be easily acquired from the ordinary market, simply contribute to the I/O switch as its main components.

When an electronic device includes many circuit boards, how to effectively assemble these circuit boards is an important issue to compact its volume. A conventional design positions the circuit boards on the same plate within the case of an electronic device. The conventional design simplifies the fabrication of electronic devices, but expands the spaces they occupy. Another conventional design of electronic devices stacks several circuit boards up by fixing and separating them with bolts and nuts, therefore, minimizing the spaces they occupy.

FIG. 1 illustrates the conventional stacked circuit board structure. Typically, the base 1, which is made of rigid material for housing the first circuit board 5 and the second circuit board 3, includes fixing holes 8a, 8b, 8c, and 8d (hereinafter refer to 8) and pillars 2a, 2b, 2c, and 2d (hereinafter refer to 2) extruding from its bottom plate. The first circuit board 5 includes first bolt holes 6a, 6b, 6c, and 6d (hereinafter refer to 6). Likewise, the second circuit board 3 includes second bolt holes 9a, 9b, 9c, and 9d (hereinafter refer to 9) and lead holes 4a, 4b, 4c, and 4d (hereinafter refer to 4). Since the lead holes 4, which are positioned corresponding to the pillars 2, have inner diameters broader than those of the pillars 2, the second circuit board 3 can be mounted right on the bottom plate of the base 1 by screwing bolts 11a, 11b, 11c, and 1ld through the second bolt holes 9 and fixing holes 8. Moreover, since the first holes 6, which are positioned corresponding to the pillars 2, have inner diameters narrower than those of the pillars 2, the first circuit board 5 can be mounted right on the pillars 2 by screwing bolts 7a, 7b, 7c, and 7d through the first bolt holes 6 into the pillars 2. Therefore, the base 1 in which the first circuit board 5 stacked above the second circuit board 3, compacts the volume of the electronic device adopting the stacked circuit board structure within the base 1.

Although the aforementioned stacked circuit board structure enables electronic devices to minimize their volume, its bolts holes 6, 9 and lead holes 4 interfere in the design of the circuitry layout of the two circuit boards 3, 5. Generally, fixing an upper circuit board, namely the circuit board on the pillars, needs at least four bolt holes thereon, and especially to the lower circuit board, namely the circuit board on the bottom plate of the base, it demands extra four lead holes. As a result of these holes, especially of the lead holes, which allow no conducting lines to cross through, the stacked circuit board structure labors the design of the circuits.

In addition, there are usually several bolt holes on the corners of a circuit board for facilitating its assembly, when the manufacturer fabricates the circuit board. However, the conventional stacked circuit board structure demands extra lead holes, which are not inherently on the circuit board. For accommodating to the conventional structure, the circuit board must be completely redesigned instead of acquiring it from the ordinary market, thereby raising its fabricating cost.

In brief, there is a huge need to resolve the disadvantages of the conventional stacked circuit board structure as well as compact the electronic device adopting many circuit boards.

SUMMARY OF THE INVENTION

An objective of the invention is to provide a mechanism for assembling a plurality of circuit boards along the vertical direction.

Another objective of the invention is to provide a switch box with stacked circuit board structure for communicating among computer peripheral devices.

The invention discloses a circuit board assembly mechanism employed in a switch box, which communicates many computer peripheral devices, for assembling a plurality of circuit boards along the vertical direction. The switch box includes a first circuit board and a second circuit board, in which the second circuit board has a third hole, and the first circuit board has a first hole and a second hole opposite to the first one. The circuit board assembly mechanism mainly includes a base and connecting bracket. The base housing the first circuit board and the second circuit board comprises a bottom plate, a side plate, and a boundary plate. The bottom plate has a fourth hole corresponding to the third hole and a pillar extruding from it corresponding to the first hole. The second circuit board is mounted on the bottom plate by inserting a first fixer through the fourth hole and the third hole, and the first circuit board is mounted on the pillar above the second circuit board by inserting a second fixer through the first hole into the pillar. Bending the side plate, which is bent from a wing of the bottom plate, shapes the boundary plate, on which a split exists corresponding to the second hole. A perpendicular first strip and a second strip shape the connecting bracket. The first strip has a foot hole for fixing the connecting bracket with the first circuit board by inserting a third fixer through the second hole and the foot hole. The second strip has a flange corresponding to the split for restringing the connecting bracket in the boundary plate by inserting the flange into the split, thereby connecting the first circuit board with the side plate of the base.

DETAILED DESCRIPTION OF THE PREFERRED EMBODIMENT

The present circuit board assembly mechanism mainly includes a base and a connecting bracket. Several pillars extrude from the bottom plate of the base. A circuit board, on which several holes corresponding to the pillars exist adjacent to its edge, is mounted on the pillars by inserting fixers, such as bolts, nails, and welding spots, through the holes into the inner tubes of the pillars. A connecting bracket mounted on an opposite edge of the circuit board is restricted on a side plate of the base. By the pillars and the connecting bracket, the circuit board is firmly fixed above the bottom plate within the base, so that a space between the circuit board and the bottom is able to receive yet another circuit board, thereby stacking circuit boards along the vertical direction. Since only the holes are positioned close to the edge of the circuit board, the present mechanism would not affect its circuitry layouts and those of any circuit boards mounted on the bottom plate. For depicting the invention clearly, a preferred embodiment is illustrated as follows.

Figure 1:
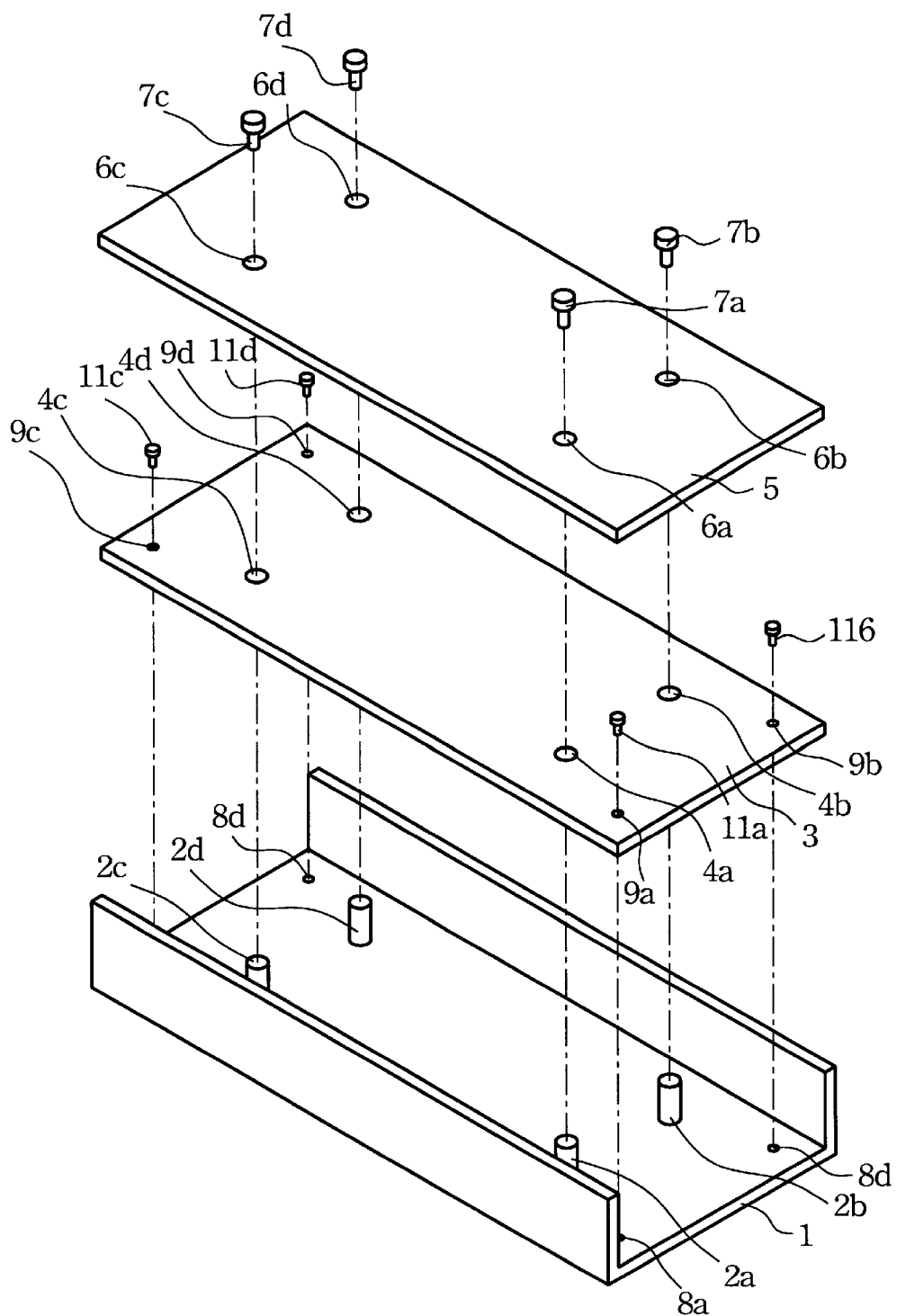
FIG. 1 shows a three-dimensional view of a conventional stacked circuit board structure.
Figure 2:
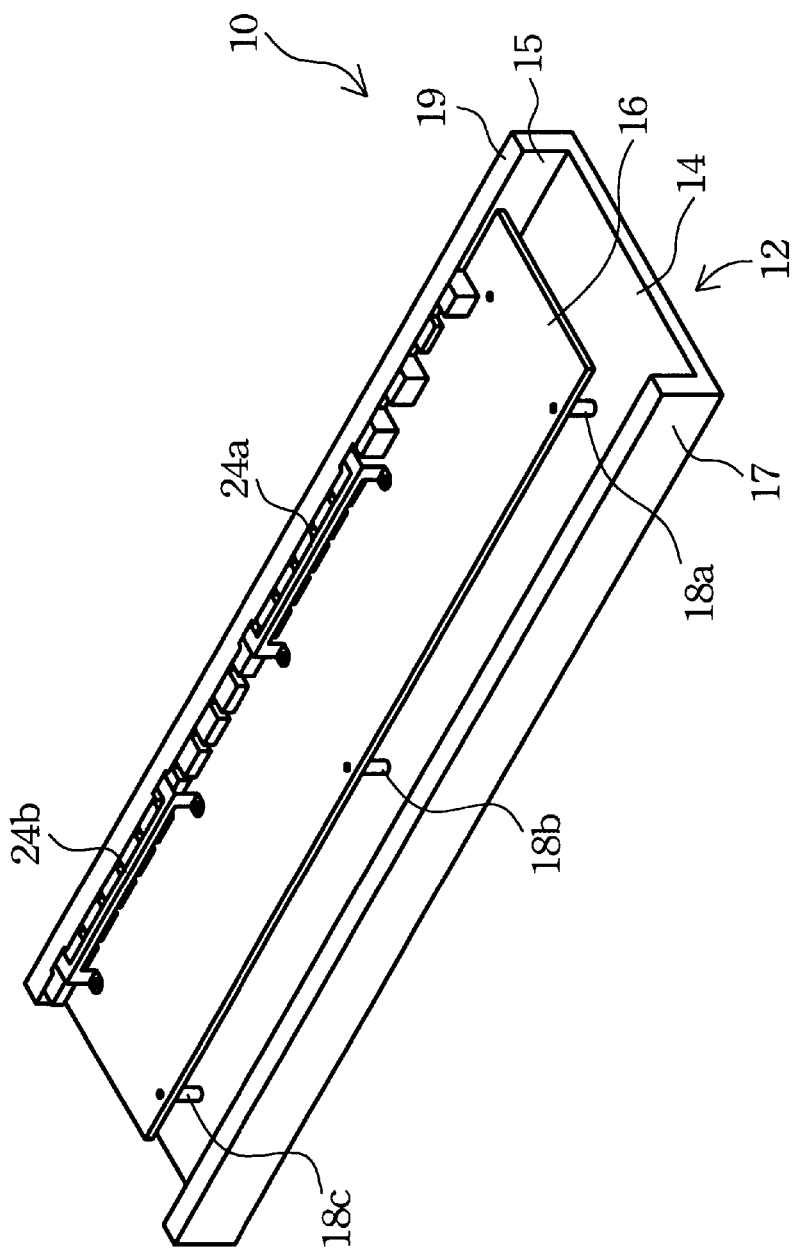
FIG. 2 shows a three-dimensional view of the present circuit board assembly mechanism.

FIG. 2 shows a circuit board assembly mechanism 10 employed in a switch box (not shown in this figure), which communicates signals among computer peripheral devices. However, it's noticed that the circuit board assembly mechanism 10 is not limited to apply in the switch box, it can be used in any electronic devices including many circuit boards.

In this preferred embodiment, the circuit board assembly mechanism 10 mainly includes a base 12 and connecting brackets 24a, 24b (hereinafter refer to 24). The base 12 is made of rigid materials for housing the first circuit board 16. According to the structure, the base 12 is divided into the bottom plate 14, back plate 17, front plate 15, and boundary plate 19. Several pillars 18a, 18b, 18c (hereinafter refer to 18), on which the first circuit 16 rests, extrudes up from the bottom plate 14 as a row. A wing of the bottom plate 14 is bent up forming the front plate 15. Likewise, a wing of the front plate 15 is bent inwardly toward the base 12 forming the boundary plate 19.

The connecting bracket 24 connects the first circuit board 16 with the base 12 by mounting its first end on the first circuit board and restricting its opposite second end in the boundary plate 19. By the pillars 18 and connecting brackets 24, the first circuit plate 16 is suspended in the base 12 above the bottom plate 14. Moreover, the circuit board provides a space between the first circuit board 16 and bottom plate 14 for assembling a second circuit board (not shown in this figure) within the base 12. In addition, the second circuit board can be mounted on the bottom plate 14 by traditional mechanism. For instance, employing fixers insert through the bolt holes (not shown in this figure) of the second circuit board and the bottom plate 14. However, because the traditional mechanism is well known to persons skill in the art, for avoiding redundant, there are no further descriptions about it.

Figure 3B:
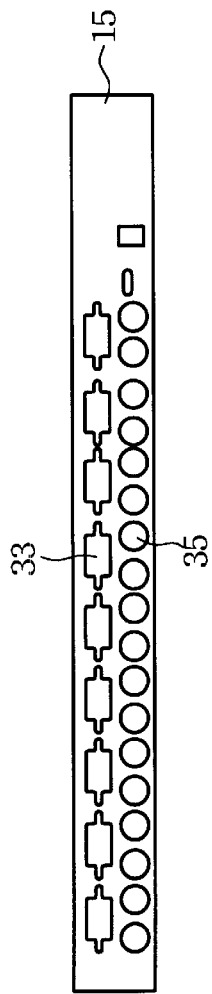
FIG. 3B shows a front view of the present circuit board assembly mechanism.
Figure 3C:
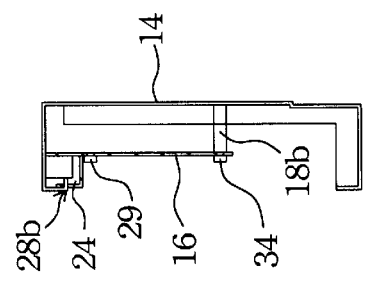
FIG. 3C shows a cross-sectional view of the present circuit board assembly mechanism.
Figure 3A:
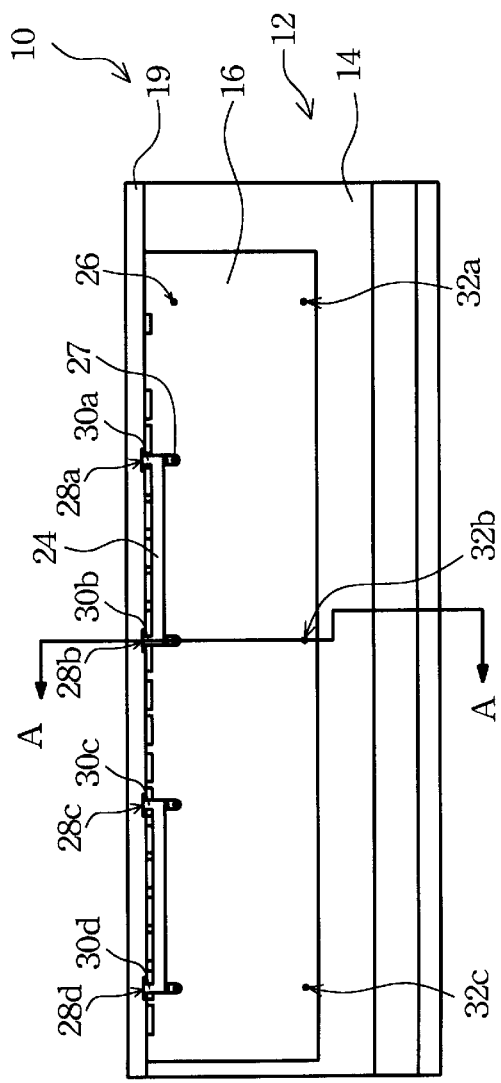
FIG. 3A shows a top view of the present circuit board assembly mechanism.
Figure 4:
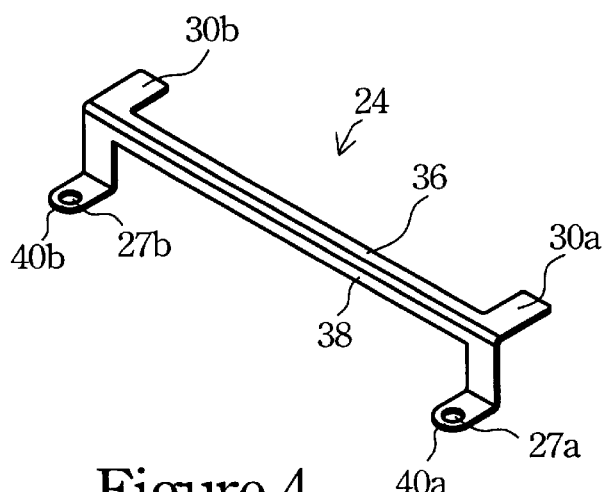
FIG. 4 shows a three-dimensional view of the connecting bracket of the circuit board assembly mechanism.
Figure 5B:
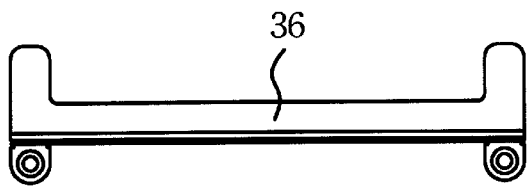
FIG. 5B shows a top view of the connecting bracket.
Figure 5A:
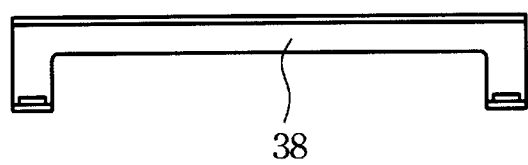
FIG. 5A shows a front view of the connecting bracket.
Figure 5C:
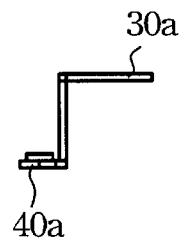
FIG. 5C shows a side view of the connecting bracket.

FIG. 3A, FIG. 3B, and FIG. 3C illustrate a top view, front view, and cross-sectional view taken along the A—A line of the present circuit board assembly mechanism, respectively. Initially referring to FIG. 3A and FIG. 3C, several pillars 18 with inner tubes extrudes from the bottom plate 14. Several first holes 32a, 32b, 32c (hereinafter refer to 32) corresponding to the pillars 18 exist adjacent to a first edge of the first circuit board 16. For mounting the first circuit board 16, fixers 34 are inserted through the first holes 32 into the inner tubes of the pillars 18, thereby fixing the first circuit board 16 suspending above the bottom plate 14. In this preferred embodiment, the fixers 34 are bolts, which screw into the inner tubes of the pillars 18. However, the fixers 34 can be nails and welding spots combining the first circuit board 16 and pillars 18 as alternatives.

Still referring to FIG. 3A and FIG. 3C, the second holes 26 exist adjacent to a second edge of the first circuit board 16, which opposites to the first edge. The connecting brackets 24 have foot holes 27 at their ends and flanges 30a, 30b, 30c, and 30d (hereinafter refer to 30) at the opposite ends. By inserting fixers 29 through the foot holes 27 and their corresponding second holes 26, the connecting brackets 24 are mounted on the first circuit plate 16. Furthermore, the boundary plate 19 has several splits 28a, 28b, 28c, and 28d (hereinafter refer to 28) corresponding to the flanges 30. Since the widths of the splits 28 are broader than those of the flanges 30, the connecting brackets 24 can be restricted in the boundary plate 19 by simply inserting the flanges 30 into the splits 28. Therefore, by the support of the pillars 18 and connecting brackets 24, the first circuit board 16 is fixed above the bottom plate 14 in the base 12. When mounting a second circuit board (not shown in this figure) on the bottom plate 14 under the first circuit board 16, the circuit board assembly mechanism 10 stacks the two circuit boards along the vertical direction.

Referring to FIG. 3B, there are many openings, such as display interfacial port openings 33 and keyboard/mouse connecting port openings 35, for exposing the connecting ports of the circuit boards fixed within the base 12 (see FIG. 3A). It's understood that the display interfacial port openings 33 and keyboard/mouse connecting port openings 35 are arranged as two stacked rows, since the present circuit board assembly mechanism fixes circuit boards along the vertical direction. In this preferred embodiment, the keyboard/mouse connecting port openings 35 are arranged higher than the display interfacial port openings 33. Thus, a plug may easily insert or release through the keyboard/mouse connecting port openings 35 without the interference from the monitor plugs inserting into the monitors 33. However, the monitor openings 33 can also be placed higher than the keyboard/mouse connecting port openings 35, depending on various cases.

FIG. 4, FIG. 5A, FIG. 5B, FIG. 5C, and FIG. 5D, show a three-dimensional view, front view, top view, and side view of connecting bracket 24, respectively. The connecting bracket 24 is shaped by bending a rigid material into an L-shaped truss with a first strip 38 and a second strip 36. At an end of the first strip 38, extensions 40a, 40b, on which foot holes 27a, 27b rest at positions corresponding to the second holes 26 (see FIG. 3A), are bent to parallel with the first circuit board 16 (see FIG. 2). As a result, the connecting bracket 24 can be fixed on the first circuit plate 16 by inserting fixers through the foot holes 27 and second holes 26. In addition, the second strip 36 has protruded flanges 30a, 30b corresponding to the splits 28 of the boundary plate 19 (see FIG. 3A). Therefore, the first circuit board 16, which is connected with the connecting bracket 24, can further be restricted in the boundary plate 19 by inserting the flanges 30 into the splits 28. It's noticed that, the connecting brackets 24 are not limited to L-shaped truss. Indeed, they can also be L-shaped beams and L-shape sheets as alternatives.

The pillars of the circuit board assembly mechanism is positioned close to the edge of the upper circuit board, i.e. the first circuit board, so that they affect the circuitry layout of the lower circuit board, i.e. the second circuit board, little. Moreover, since the connecting bracket connects the base with an edge of the upper circuit board, where complicated conducting lines are coupled to many I/O ports, merely by inserting fixers into bolt holes and hanging the flanges in the boundary plate, the circuit board assembly mechanism fixes the upper circuit board above the bottom plate of the base without seriously damaging its circuitry layout, due to large lead holes. In other words, the circuit board assembly mechanism has the advantages to fix the upper circuit board above the lower circuit board without seriously affecting its circuitry layout.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A circuit board assembly mechanism for assembling a first circuit board in suspension in the circuit board assembly mechanism, thereby reserving a space under the first circuit board within the circuit board assembly mechanism for assembling a second circuit board, the first circuit board having a first hole and a second hole facilitating the first circuit board to be mounted in the circuit board assembly mechanism, the circuit board assembly mechanism comprising:
   a base having a pillar extruding from a bottom plate of the base and a side plate bending from a wing of the bottom plate, the pillar positioned corresponding to the first hole for housing the first circuit board atop by inserting a fixer through the first hole and the pillar; and
   a connecting bracket having a first end and a second end in opposition to each other for connecting the first circuit board with the side plate of the base by fixing the first end on the first circuit board and restricting the second end on the side plate, thereby assembling the first circuit board in suspension within the base by the pillar and the connecting bracket and reserving the space between the first circuit board and the bottom plate for the second circuit board;
      wherein the first end is an extension bent from the connecting bracket, the extension having a foot hole corresponding to the second hole for connecting the first circuit board with the connecting bracket by inserting a fixer through the foot hole and the second hole.

2. The circuit board assembly mechanism of claim 1, wherein the bottom plate has a plurality of first bolt holes for facilitating the second circuit board to be mounted thereon.

3. The circuit board assembly mechanism of claim 1, wherein the base has a boundary plate bending from a wing of the side plate, the boundary plate further having a split receiving the second end, restricting the connecting bracket on the side plate.

4. The circuit board assembly mechanism of claim 3, wherein the second end is shaped as a flange in a width smaller than the split for loosely inserting into the split.

5. The circuit board assembly mechanism of claim 1, wherein the connecting bracket comprises an L-shaped truss, an L-shaped beam, or an L-shaped sheet.

6. The circuit board assembly mechanism of claim 1, wherein the first circuit board has a plurality of input/output ports for coupling with a plurality of computer peripheral devices.

7. The circuit board assembly mechanism of claim 6, wherein the side plate has a plurality of openings for exposing the input/output ports.

8. An input/output switch box enclosing a stacked circuit board structure for communicating among a plurality of computer peripheral devices, the input/output switch box comprising:
   a first circuit board having a plurality of first input/output ports for coupling with the computer peripheral devices, the first circuit board further having a first hole adjacent to a first edge of the first circuit board and a second hole adjacent to a second edge opposite to the first edge of the first circuit board;
   a second circuit board having a third hole and a plurality of the second input/output ports for coupling with the computer peripheral devices;
   a base for housing the first circuit board and the second circuit board, further comprising:
      a bottom plate having a fourth hole corresponding to the third hole and a pillar extruding from the bottom plate at a position corresponding to the first hole, the second circuit board being mounted on the bottom plate by inserting a first fixer through the fourth hole and the third hole, the first circuit board being mounted on the pillar by inserting a second fixer through the first hole into the pillar, being suspended above the bottom plate,
      a side plate shaped by bending a wing of the bottom plate, having a plurality of openings for exposing the first input/output ports and the second input/output ports, and
      a boundary plate shaped by bending the side plate inner toward the base, having a split at a position corresponding to the second hole; and
   a connecting bracket for connecting the first circuit board with the side plate of the base, further comprising:
      a first strip having a foot hole for fixing the connecting bracket with the first circuit board by inserting a third fixer through the second hole and the foot hole, and
      a second strip bent from the first strip, having a flange corresponding to the split for restricting the connecting bracket in the boundary plate by inserting the flange into the split;
      wherein the first circuit is fixed by the pillar and connecting bracket, thereby suspending above the second circuit board forming a stacked circuit board structure within the base.

9. The input/output switch box of claim 8, wherein the connecting bracket comprises an L-shaped truss, an L-shaped beam, or an L-shaped sheet.

10. The input/output switch box of claim 8, wherein the first fixer, the second fixer, and the third fixer comprise a screw bolt, a nail, or a welding spot.

* * * * *